United States Patent
Miller et al.

(10) Patent No.: US 6,941,249 B1
(45) Date of Patent: Sep. 6, 2005

(54) SYSTEM AND METHOD OF VIRTUAL FLOWBENCH SIMULATION

(75) Inventors: Ronald H. Miller, Saline, MI (US); Gary S. Strumolo, Beverly Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 09/468,537

(22) Filed: Dec. 20, 1999

(51) Int. Cl.[7] ............................. G06F 17/50; G06G 7/48
(52) U.S. Cl. ..................... 703/1; 703/6; 703/7; 703/8; 703/9
(58) Field of Search ..................................... 703/1, 6–9

(56) References Cited

U.S. PATENT DOCUMENTS

| | | | |
|---|---|---|---|
| 4,809,202 A | | 2/1989 | Wolfram |
| 5,432,718 A | | 7/1995 | Molving et al. |
| 5,455,780 A | | 10/1995 | Nguyen et al. |
| 5,537,641 A | | 7/1996 | da Vitoria Lobo et al. |
| 5,594,671 A | | 1/1997 | Chen et al. |
| 5,640,335 A | | 6/1997 | Molving et al. |
| 5,649,064 A | | 7/1997 | Jorgensen et al. |
| 5,663,890 A | * | 9/1997 | Saleh et al. ............... 703/4 |
| 5,751,607 A | | 5/1998 | Ohta |

OTHER PUBLICATIONS

"Where to see Exa & PowerFLOW in the news" (pp. 1–3); http://www.exa.com/newsite/newsevents/inthenews.htm; Feb. 4, 2003.*

PowerFLOW News, vol. 4.0, 1998 (pp. 1–4); 1998.*

PowerFLOW ("Fluid flow for competitive design"); numbered pp. 1–11; http://www.com.pdf/Exa_Brochure98pdf; 1998.*

PowerFLOW User's Guide, Release 3.0, copyright 1998.

R. Miller, et al., "A Comparison of Experimental and Analytical Steady State Intake Port Flow Data using Digital Physics", SAE Technical Paper Series 1999-01-1183, International Congress and Exposition, Detroit, Michigan, Mar. 1–4, 1999, two cover pages and pp. 1–8, 1999.

(Continued)

*Primary Examiner*—Hugh Jones
(74) *Attorney, Agent, or Firm*—David B. Kelley; Brooks & Kushman

(57) ABSTRACT

A computerized method of virtual flowbench simulation of fluid flow interaction with an object described in at least one design file includes receiving user-defined input via a user interface, the user-defined input including a specification of the at least one design file, accessing the at least one design file, and accessing a generic template describing basic geometries of the object, and modifying the basic geometries of the object with the at least one design file. Automatically, surface and volume mesh are generated in the object, and fluid flow interaction with the object is simulated. Predetermined data parameters are measured and stored during simulation. The method automatically checks the predetermined data parameter measurements to determine whether steady state has been reached and whether a predetermined maximum number of time steps has been reached. The method then automatically terminates the simulation in response to the steady state being reached or the predetermined maximum number of time steps being reached. An output of predetermined data parameter measurements is then generated.

24 Claims, 4 Drawing Sheets

OTHER PUBLICATIONS

R. Miller, et al., "A Design of Experiment Using Computation Fluid Dynamics for Spool–Type Hydraulic Valves," ASME International, pp. 325–334, 2000.

R. Miller, et al. "High Performance Computing: Analytical Aerodynamics for Automotive Vehicles," ASME International, pp. 289–298, 1999.

R. Miller, et al., "CFD Simulation of Steady–State Flow Forces on Spool–Type Hydraulic Valves," SAE Technical Paper Series, cover page and pp. 295–307, 1999.

G. Strumolo and V. Babu, "New direction in computational aerodynamics," Physics World, pp. 45–49, 1997.

Exa Corporation, "PowerFlow Specifications," 4 pages, 1998.

Exa Corporation, "PowerFlow Validation—Intake Ports," 3 pages, 1999.

Exa Corporation, "About PowerFlow," 2 pages, Nov. 26, 2003.

Exa Corporation, "Frequently Asked Questions," 3 pages, Apr. 1998.

Fluent, "CFD for the Automotive Industry," 3 pages, no date.

Fluent, "Accelerate your design process," 6 pages, 2003.

Fluent, "Flow Modeling for the Automotive Industry," 2 pages, Nov. 26, 2003.

Fluent, "Computer Simulation of Inlet Port Helps Improve Fuel Economy and Emissions," 3 pages, 1999.

Fluent, "Simulation Helps Adapt Intake Manifold for Multiple Models, Saving Millions," 3 pages, 2002.

Fluent, "Intake Valves," 1 pages, 2003.

\* cited by examiner

SYSTEM AND METHOD OF VIRTUAL FLOWBENCH SIMULATION

TECHNICAL FIELD OF THE INVENTION

This invention is related in general to the field of computer-aided design and simulation. More particularly, the invention is related to system and method of virtual flowbench simulation.

BACKGROUND OF THE INVENTION

A steady-state flowbench is a method of testing the design of intake and exhaust ports and valves of an engine. The flowbench method measures the mass and angular momentum flux for a given cylinder head intake port design over varying valve lifts and pressure drops. The flowbench method may also be used to test intake or exhaust valve design. The volumetric efficiency and burn rate of the design can then be determined from mass and angular momentum flux. The drawback of this methodology is that a multiple cylinder head castings or soft prototypes have to be constructed for the test. Although the use of soft prototypes provide substantial time and cost savings over metal prototypes, the turnaround time to build the soft prototypes and measuring air flow over and through the soft prototypes mounted in an experimental flowbench rig is still in the range of one to two months to determine the efficiency of a single new design. If multiple designs require verification, then the entire process would require several months to complete.

SUMMARY OF THE INVENTION

Accordingly, there is a need for a virtual flowbench simulation system and process that enable a design engineer to simulate fluid flow interaction around his/her designed part without having to have specialized simulation knowledge or expertise. Furthermore, simulation may be performed as a computerized and automated process without requiring the use of soft prototypes. In accordance with the present invention, a virtual flowbench simulation system and method are provided which eliminates or substantially reduces the disadvantages associated with prior methodologies.

In one aspect of the invention, a computerized method of virtual flowbench simulation of fluid flow interaction with an object described in at least one design file includes receiving user-defined input via a user interface, the user-defined input including a specification of the at least one design file, accessing the at least one design file, and accessing a generic template describing basic geometries of the object, and modifying the basic geometries of the object with the at least one design file. Automatically, surface and volume mesh are generated in the object, and fluid flow interaction with the object is simulated. Predetermined data parameters are measured and stored during simulation. The method automatically checks the predetermined data parameter measurements to determine whether steady state has been reached and whether a predetermined maximum number of time steps has been reached. The method then automatically terminates the simulation in response to the steady state being reached or the predetermined maximum number of time steps being reached. An output of predetermined data parameter measurements is then generated.

In another aspect of the invention, a computerized method of virtual flowbench simulation of fluid flow interaction with a part in a cylinder head described in at least one design file includes first receiving user-defined input via a graphical user interface, the user-defined input including a specification of the at least one design file, then accessing the at least one design file, and then accessing a generic template describing basic geometries of the cylinder head, and modifying the basic geometries of the cylinder head with the part defined in the at least one design file. The method then automatically generates surface and volume mesh in the modified cylinder head geometry, and automatically simulates fluid flow interaction with the modified cylinder head and measuring and storing a mass flow data through inlet, port and outlet and around a valve displaced a predetermined distance from the inlet. The method automatically checks the mass flow data to determine whether steady state has been reached and whether a predetermined maximum number of time steps has been reached. The method then automatically terminates the simulation in response to the steady state being reached or the predetermined maximum number of time steps being reached. An output is then generated.

In yet another aspect of the invention, a virtual flowbench simulation system is used to simulate fluid flow associated with a part described in a design file, where the part is a portion of a component. The system includes a graphical user interface operable to receive user-defined input specifying the design file, the type of part to be simulated, and other simulation parameters, and a generic template describing basic geometries and boundary conditions of the component. An autogridding process is operable to automatically generate surface and volume meshes in the component with the part described in the user-specified design file, and a computational fluid dynamic simulation process is operable to automatically simulate fluid flow in and around the component and measuring data. A controller is operable to monitor the computational fluid dynamic simulation process and issue simulation progress reports. The controller is further operable to terminate the simulation process when a steady state in measured data is reached or when a predetermined maximum time step is reached. A measurement data output process is operable to format and output the measured data in a user-specified representation.

BRIEF DESCRIPTION OF THE DRAWINGS

For a better understanding of the present invention, reference may be made to the accompanying drawings, in which.

DETAILED DESCRIPTION OF THE INVENTION

Figure 1:
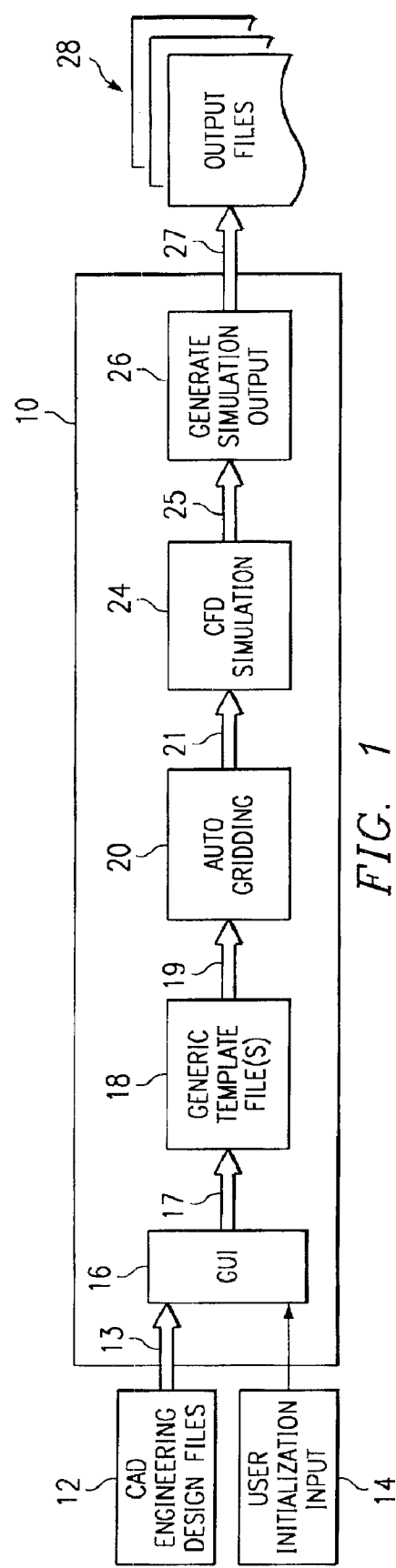
FIG. 1 is a simplified block diagram of the virtual flowbench system and method constructed according to an embodiment of the present invention.

FIG. 1 is a simplified block diagram of a virtual flowbench system and method 10 constructed according to an embodiment of the present invention. Virtual flowbench system and method 10 may be used to measure discharge coefficients and angular momentum flux of the port and valve in a cylinder head, which may in turn be used to determine the burn rate of the cylinder design. Virtual flowbench system 10 receives computer-aided design (CAD) engineering design files 12 and user initialization inputs 14 via a graphical user interface 16. Engineering design files 12 are solid model representations of parts or objects, such as new port and valve designs for an automotive engine. Engineering design files 12 may be in any CAD file format, such as Stereolithogram™ (STL), Nastran™, and Ansys™. User initialization inputs 14 may include user commands, user specification of the number of simulations to perform, user specification of the type of simulation to perform, etc. One or more generic template files 18 are modified to incorporate the information provided by user initialization inputs 14 and engineering design files 12.

Generic template files 18 define the basic geometry and solid model of the component to be simulated. For example, generic template file 18 may define the various parts of the component to be simulated as a solid, and what the boundary conditions are. For example, generic template files 18 may define the basic geometry of two-valve, three-valve, and four-valve engine cylinders. For each engine cylinder configuration, each part is further defined. For example, an inlet is defined as a solid with its basic geometry and the boundary conditions applied to the inlet is the atmospheric pressure plus a user-defined pressure drop between the inlet and outlet; an outlet is defined as a solid and the boundary condition applied to the outlet is atmospheric pressure; a port and valve(s) are defined as solid parts with the basic geometry thereof; a flux region is defined and its location in the geometry as the measurement region where flow data is calculated and stored. Furthermore, generic template files 18 define simulation parameters such as the maximum number of time steps for the simulation, and how often results are stored or written to disk (not shown explicitly). Generic template files 18 further supplies parameters for an autogridding process 20 such as region scaling and resolution.

The user input and the user-specified CAD files are used to modify the basic geometries defined in the generic template files so that the specific part being simulated on has the desired geometries defined in CAD engineering design files 12. For example, CAD engineering design files 12 may describe a solid model of a new port design. The basic geometry of the port in generic template files 18 is then replaced by the geometry defined in engineering design files 12, and the other parts in the cylinder head remain unchanged from what is defined by generic template files 18.

Autogridding process 20 is then automatically activated to create a surface mesh and volume grid of the resultant engine cylinder head with the new port and/or valve designs. Autogridding process 20 breaks down the cylinder head into small discrete computational blocks or polygons. A computational fluid dynamics (CFD) simulation process 24 then takes place to simulate fluid flow and measure flow rates, density, pressure, temperature, etc. at the predetermined flux region. For a port or valve study of an engine cylinder, the measurement region may be a spot approximately ⅔ way down the depth of the cylinder as defined in generic template files 18.

In an embodiment of the present invention, POWERFLOW™ is used to perform autogridding and simulation. POWERFLOW™ is a commercially available lattice gas technology software program that is made available by EXAM. Its autogridding process produces a high resolution Cartesian volume mesh (3–20 million cells). Nesting of variable mesh density regions is used in order to concentrate grid resolution in regions where the geometry dominates the flow dynamics, while reducing grid resolution in regions of less interest. Further, POWERFLOW™ determines fluid motion through a series of particle collisions and advections on a regular lattice grid. These collisions satisfy rules that conserve mass, energy, and momentum and thereby are solutions to the partial differential Navier-Stokes equations that are traditionally used in CFD simulation tools.

Virtual flowbench system 10 continuously monitors the simulation process and stops the simulation when certain predetermined conditions are true, such as when the measurements reach steady state. All simulation cases specified by the user are performed in this fashion. System 10 then generates simulation output in block 26, and prepares output files 28. Depending on user preference, the output may be in a number of user-selectable formats. For example, one user may be interested in simple plots of simulation measurements, another user may be interested in a graphical representation or animation of the fluid flow across selected cross-sections of the design.

Figure 2:
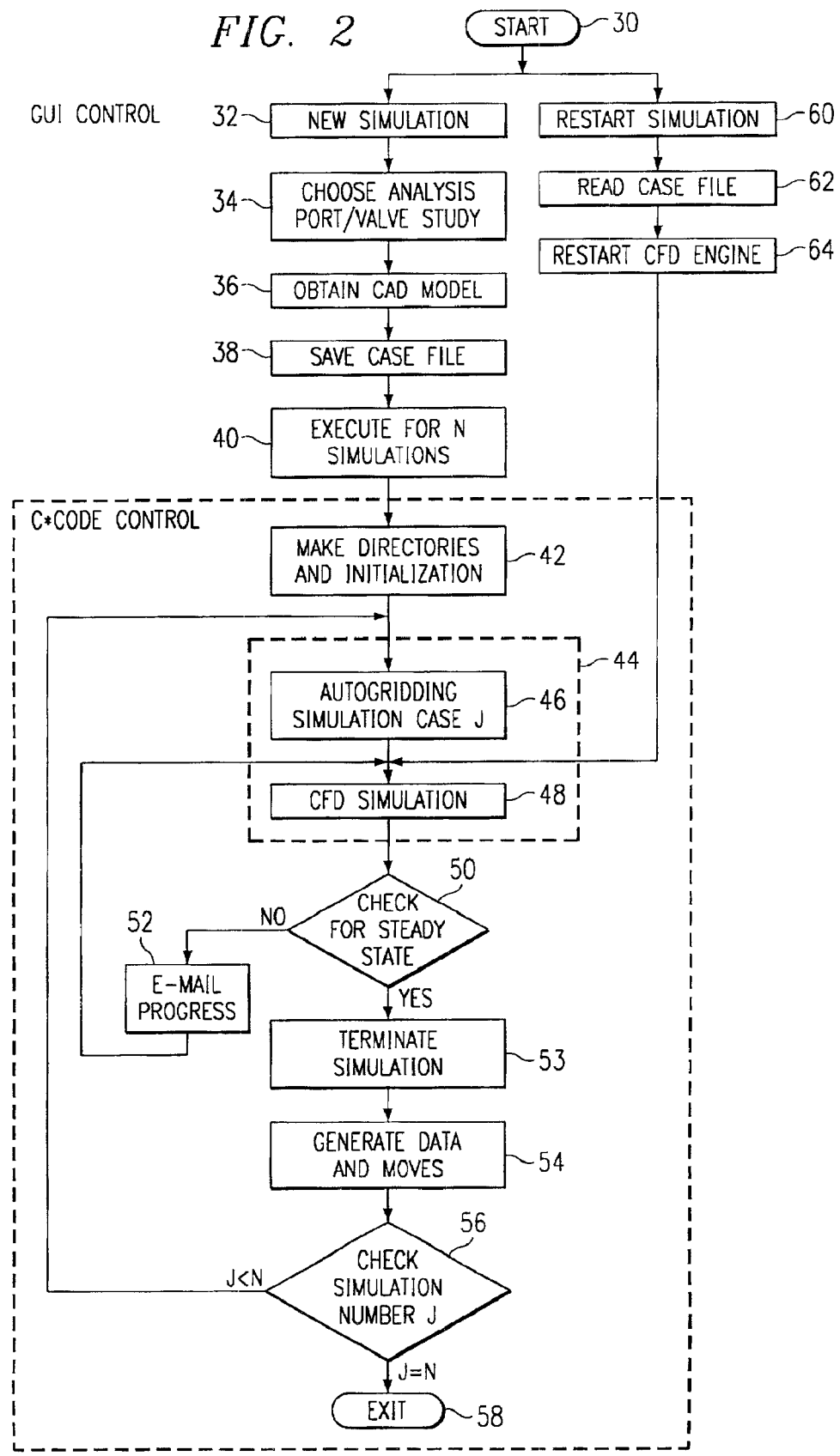
FIG. 2 is a flowchart of the virtual flowbench system and method constructed according to an embodiment of the present invention.

FIG. 2 is a flowchart of the virtual flowbench system and method 10 constructed according to an embodiment of the present invention. Beginning in block 30, the system and method 10 of the present invention provides a graphical user interface that displays a menu, buttons, and input fields. The user may select from a menu or a number of clickable buttons, for example, new simulation in block 32 or restart simulation in block 60. If the simulation case has never been entered on the system previously, the user should select new simulation, otherwise, the user may restart a simulation that is already stored in the system that was aborted or otherwise terminated prematurely. When the user selects new simulation, he is prompted to select either a port study or a valve study in block 34. In a port study, a given port design is simulated with a number of varying valve lifts. In a valve study, a given valve design is simulated with a number of varying port pipelines. The user is then prompted to specify the files in which the CAD model resides and for other information in block 36. The simulation case is then saved in block 38. The user may then specify the number of simulations, N, to execute, in block 40. Each simulation simulates a different port pipeline for a valve study or a different valve lift for a port study. Virtual flowbench process 10 then proceeds from the graphical user interface to a simulation controller, which interacts with and monitors the simulation process.

In block 42, simulation initialization including making file directories is performed. The file directories are locations in memory where simulation output will be stored. Simulation is then performed in block 44, which includes autogridding of the simulation case in block 46 and performing the simulation in block 48. In block 50, virtual flowbench system 10 checks to determine whether steady state has been reached. Steady state may be indicated by one or more simulation measurements such as the measured flow rate changing less than 1% in successive iterations. If steady state has not been reached, then simulation continues and the user is notified of the simulation progress in block 52. Electronic mail may be one way that the user may choose to be notified. If steady state is reached, then the simulation is terminated. In block 54, output data in different forms of representation are generated and stored. The simulation continues in block 48 until the number of simulation cases, J, reaches N, as determined in block 56. Once the number of simulation cases reaches the user-entered N times, the process ends in block 58.

Figure 3:
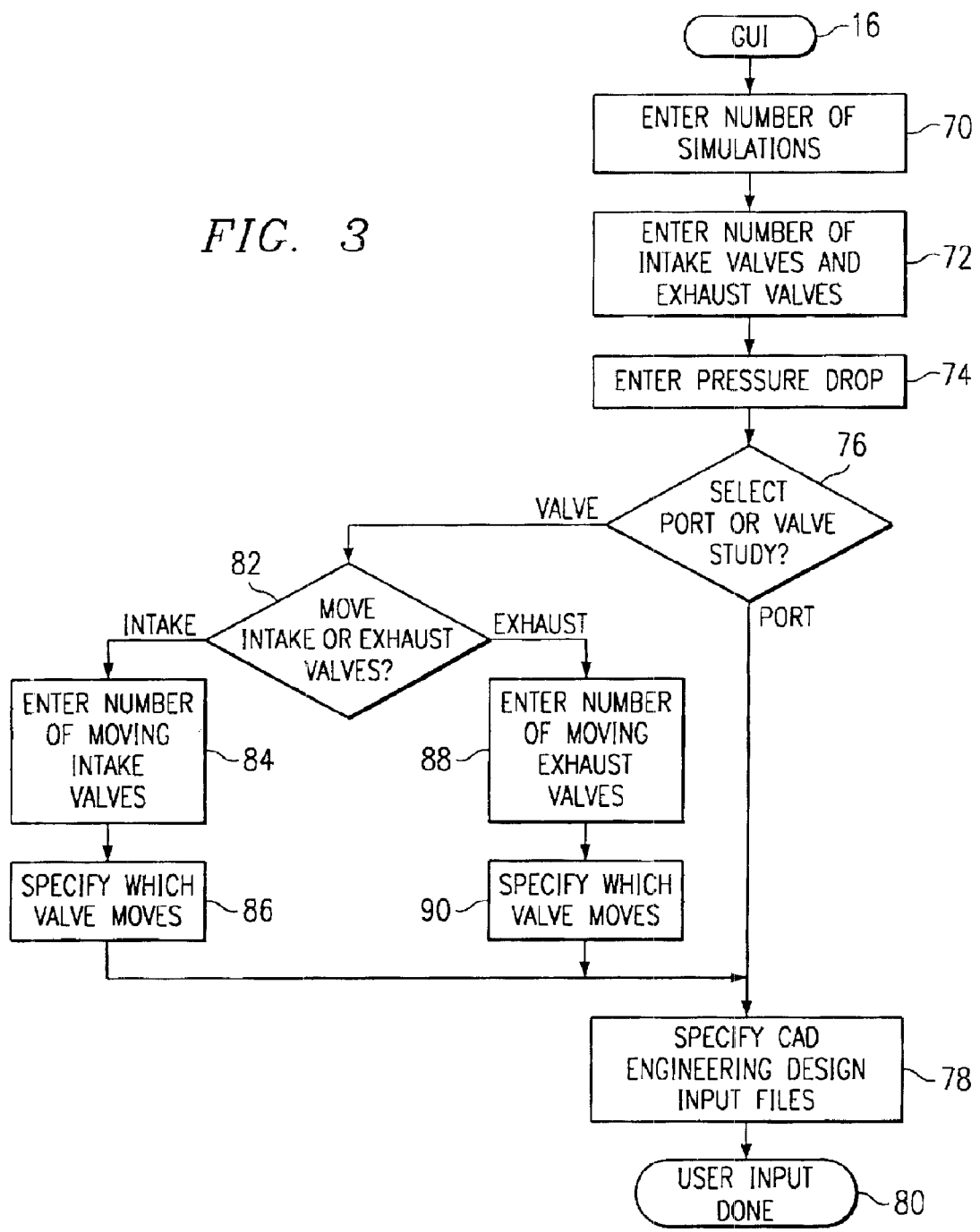
FIG. 3 is a more detailed flowchart of the graphical user interface process constructed according to an embodiment of the present invention.
Figure 4:
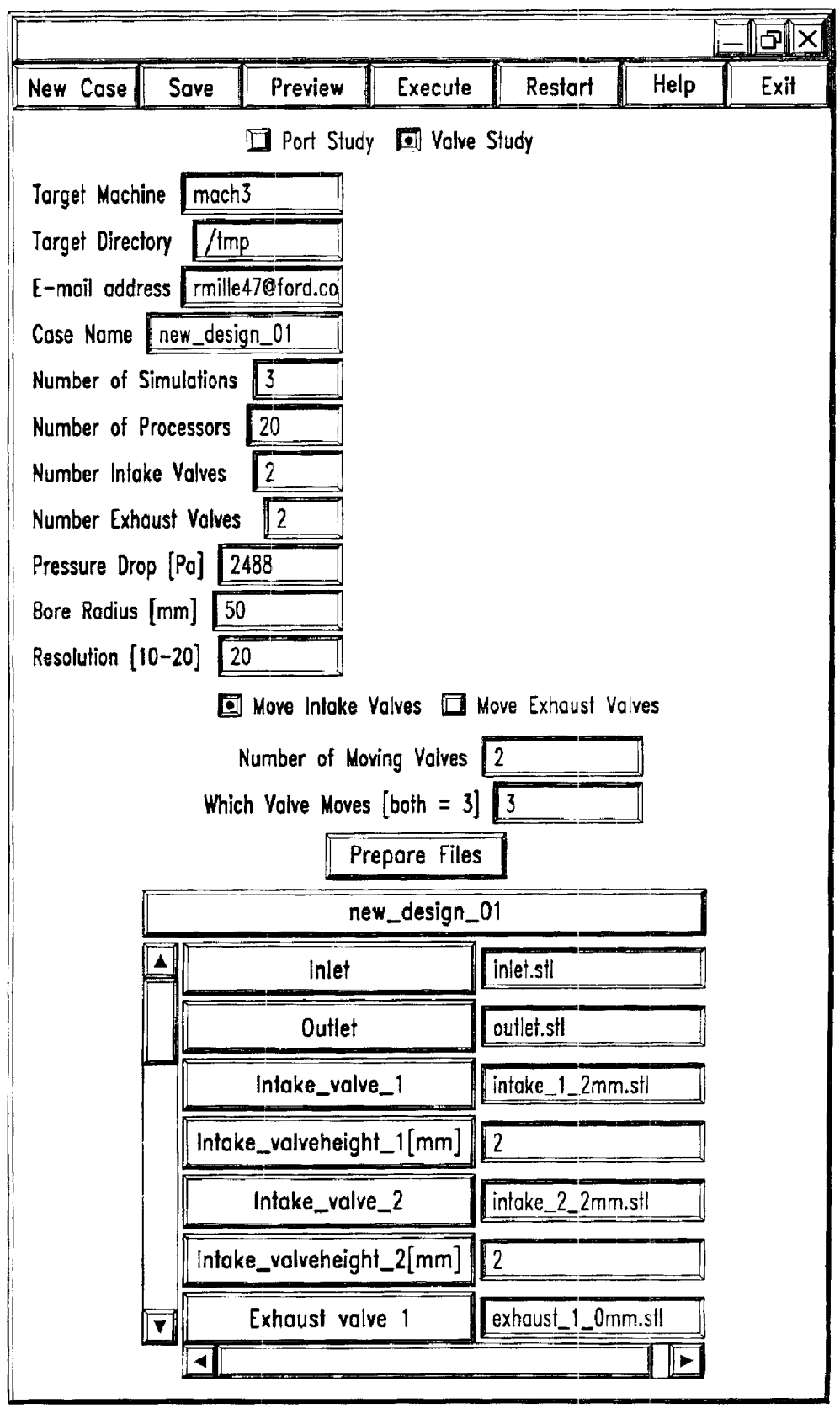
FIG. 4 illustrates an example graphical user interface according to an embodiment of the present invention.

FIG. 3 is a more detailed flowchart of an exemplary graphical user interface process 16 constructed according to an embodiment of the present invention. FIG. 4 illustrates an example graphical user interface 16. It should be noted that the exact order in which the data is entered by the user via the graphical user interface may vary from that shown in FIG. 3. Graphical user interface 16 may, at startup, display a number of clickable command buttons, including "New Case." When the user clicks on "New Case" to indicate that a new simulation case is desired, the user is prompted for additional information, such as the number of simulations, the number of intake valves and exhaust valves, and the pressure differential inside and outside of the port, as shown in blocks 70–74. In block 76, the user is prompted to indicate whether a port study or a valve study is desired. In a port study, a number of valve lift heights are simulated with a given port. In a valve study, a given valve is simulated with different port pipes. If the user selects port study, the user is further prompted to specify, by name, the CAD engineering design input files of the solid model. The user is also given the option of browsing through his/her directories to select the files. In block 80, port study is complete.

If the user desires to perform a valve study, graphical user interface 16 further prompts for a selection of intake valve study or exhaust valve study, as shown in block 82. With the selection of both types of valves, the user is further prompted to supply the number of moving valves and which valve(s) move, as shown in blocks 84–90. The user then specifies the engineering design files in block 78 and the user input for a valve study is completed in block 80. The user may then examine the data output of the simulation runs.

It may be seen that by using the virtual flowbench system and method of the present invention, fluid flow interaction with an engineering designed part may be simulated without the time-consuming construction of the soft prototypes. Furthermore, it has been shown that the test results closely correlate with those obtained in an actual flowbench setup.

The virtual flowbench simulation system and method of the present invention may be implemented in a single computer or workstation or in a client-server application where multiple users may concurrently perform simulations and access output data. The present invention is applicable to simulating those engineered parts and components where fluid dynamic testing is desired to verify the design.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A computerized method of virtual flowbench simulation of fluid flow interaction with an object described in at least one design file, comprising:
   receiving user-defined input via a user interface, the user-defined input including a specification of the at least one design file;
   accessing the at least one design file;
   accessing a generic template describing basic geometries of the object, and modifying the basic geometries of the object with the at least one design file;
   automatically generating surface and volume mesh in the object;
   automatically simulating fluid flow interaction with the object and measuring and storing predetermined data parameters;
   automatically checking the predetermined data parameter measurements to determine whether steady state has been reached and whether a predetermined maximum number of time steps has been reached;
   automatically terminating simulation in response to one of steady state being reached and the predetermined maximum number of time steps being reached; and
   generating an output of predetermined data parameter measurements.

2. The method, as set forth in claim 1, wherein accessing the at least one design file comprises accessing a solid model of a valve design.

3. The method, as set forth in claim 2, wherein receiving user-defined input further comprises receiving a selection of engine cylinder head valve study.

4. The method, as set forth in claim 2, wherein accessing a generic template comprises accessing basic geometries of a cylinder head, and modifying the basic geometries of the cylinder head with the solid model of the valve design.

5. The method, as set forth in claim 2, wherein receiving user-defined input comprises receiving a number of valves in the cylinder head.

6. The method, as set forth in claim 2, wherein receiving user-defined input comprises receiving a selection of intake or exhaust valve.

7. The method, as set forth in claim 2, wherein receiving user-defined input comprises receiving an indication of which of the intake or exhaust valve moved during simulation.

8. The method, as set forth in claim 1, wherein receiving user input further comprises receiving a selection of engine cylinder head port study.

9. The method, as set forth in claim 1, wherein receiving user input further comprises receiving simulation parameters.

10. The method, as set forth in claim 1, wherein accessing a generic template comprises accessing basic geometries of a cylinder head with geometries of an inlet, a port, and at least one intake valve and one exhaust valve.

11. The method, as set forth in claim 1, wherein accessing a generic template comprises accessing a definition of a data measurement region, simulation parameters, and mesh region scaling and resolution.

12. A computerized method of virtual flowbench simulation of fluid flow interaction with a part in a cylinder head described in at least one design file, comprising:
   receiving user-defined-input via a graphical user interface, the user-defined input including a specification of the at least one design file;
   accessing the at least one design file;
   accessing a generic template describing basic geometries of the cylinder head, and modifying the basic geometries of the cylinder head with the part defined in the at least one design file;
   automatically generating surface and volume mesh in the modified cylinder head geometry;
   automatically simulating fluid flow interaction with the modified cylinder head and measuring and storing a mass flow data through inlet, port and outlet and around a valve displaced a predetermined distance from the inlet;
   automatically checking the mass flow data to determine whether steady state has been reached and whether a predetermined maximum number of time steps has been reached;
   automatically terminating simulation in response to one of steady state being reached and the predetermined maximum number of time steps being reached; and
   generating an output.

13. The method, as set forth in claim 12, wherein receiving user input further comprises receiving an indication of whether a valve design or a port design is being simulated.

14. The method, as set forth in claim 12, wherein accessing the at least one design file comprises accessing a solid model of a valve design and receiving user input further comprises receiving a selection of engine cylinder head valve study.

15. The method, as set forth in claim 14, wherein accessing a generic template comprises accessing basic geometries of a cylinder head, and modifying the basic geometries of the cylinder head with the solid model of the valve design.

16. The method, as set forth in claim 14, wherein receiving user-defined input comprises receiving a number of valves in the cylinder head and a selection of intake or exhaust valve.

17. The method, as set forth in claim 12, wherein receiving user input further comprises receiving a selection of engine cylinder head port study.

18. The method, as set forth in claim 12, wherein accessing a generic template comprises accessing basic geometries of a cylinder head with geometries of an inlet, a port, and at least one intake valve and one exhaust valve.

19. The method, as set forth in claim 12, wherein accessing a generic template comprises accessing a definition of a data measurement region, simulation parameters, and mesh region scaling and resolution.

20. The method, as set forth in claim 12, further comprising notifying a user of simulation progress via electronic mail during simulation.

21. The method, as set forth in claim 12, wherein generating the output comprises generating a movie showing fluid flow in the cylinder head and through the port, inlet and outlet, and around the valve.

22. The method, as set forth in claim 12, wherein generating the output comprises generating a graphical plot of the mass flow data measured during simulation.

23. A virtual flowbench simulation system of a part described in a design file, the part being a portion of a component, comprising:

a graphical user interface operable to receive user-defined input specifying the design file, the type of part to be simulated, and other simulation parameters;

a generic template describing basic geometries and boundary conditions of the component;

an autogridding process operable to automatically generating surface and volume meshes in the component with the part described in the user-specified design file;

a computational fluid dynamic simulation process operable to automatically simulate fluid flow in and around the component and measuring data;

a controller operable to monitor the computational fluid dynamic simulation process and issue simulation progress reports, the controller further operable to terminate the simulation process when a steady state in measured data is reached or when a predetermined maximum time step is reached; and a measurement data output process operable to format and output the measured data in a user-specified representation.

24. The system, as set forth in claim 23, wherein the generic template describes the basic geometries of a cylinder head having a predetermined number of intake valves, a predetermined number of exhaust valves, port configuration, and inlet and outlet.

* * * * *